(12) United States Patent
Lee et al.

(10) Patent No.: US 9,091,824 B2
(45) Date of Patent: Jul. 28, 2015

(54) USER-SELECTABLE LASER AND OPTICAL TRANSMITTER HAVING THE SAME

(75) Inventors: Jie-Hyun Lee, Daejeon-si (KR); Seung-Hyun Cho, Daejeon-si (KR); Seung-Il Myong, Daejeon-si (KR); Kwang-Ok Kim, Jeonju-si (KR); Eui-Suk Jung, Daejeon-si (KR); Sang-Soo Lee, Daejeon-si (KR)

(73) Assignee: Electronics and Telecommunications Research Institute, Daejeon-si (KR)

( * ) Notice: Subject to any disclaimer, the term of this patent is extended or adjusted under 35 U.S.C. 154(b) by 99 days.

(21) Appl. No.: 13/616,725

(22) Filed: Sep. 14, 2012

(65) Prior Publication Data

US 2013/0163629 A1    Jun. 27, 2013

(30) Foreign Application Priority Data

Dec. 23, 2011    (KR) ........................ 10-2011-0141220

(51) Int. Cl.
| | |
|---|---|
| *H01S 5/00* | (2006.01) |
| *G02B 6/38* | (2006.01) |
| *H01S 5/14* | (2006.01) |
| *G02B 6/42* | (2006.01) |
| *H01S 3/1055* | (2006.01) |
| *H01S 5/022* | (2006.01) |
| *G02B 6/293* | (2006.01) |

(52) U.S. Cl.
CPC ............ *G02B 6/3845* (2013.01); *G02B 6/4215* (2013.01); *H01S 5/141* (2013.01); *G02B 6/29361* (2013.01); *G02B 6/4292* (2013.01); *H01S 3/1055* (2013.01); *H01S 5/02212* (2013.01); *H01S 5/146* (2013.01)

(58) Field of Classification Search
CPC . H01S 5/02284; H01S 5/02212; H01S 5/146; H01S 5/141; H01S 5/02208; H01S 5/1209; H01S 3/1055
USPC ............... 372/44.01, 43.01, 92, 98, 108, 102; 398/201
See application file for complete search history.

(56) References Cited

U.S. PATENT DOCUMENTS

| | | | | |
|---|---|---|---|---|
| 5,226,050 | A * | 7/1993 | Burghardt ........................ | 372/20 |
| 7,556,439 | B2 * | 7/2009 | Nakanishi et al. ............... | 385/92 |
| 7,769,295 | B2 * | 8/2010 | Sommer et al. .................. | 398/82 |
| 2002/0080833 | A1 * | 6/2002 | Matsuura et al. ................ | 372/20 |
| 2006/0280219 | A1 * | 12/2006 | Shchegrov ....................... | 372/99 |

(Continued)

FOREIGN PATENT DOCUMENTS

| | | |
|---|---|---|
| KR | 10-0772529 | 11/2007 |
| KR | 10-0945422 | 3/2010 |

(Continued)

*Primary Examiner* — Colleen A Matthews
*Assistant Examiner* — Delma R Forde
(74) *Attorney, Agent, or Firm* — Nelson Mullins Riley & Scarborough LLP; Anthony A. Laurentano, Esq.; Lewis Lee, Esq.

(57) ABSTRACT

Provided are a user-selectable laser and an optical transmitter including the same. The user-selectable laser is an external cavity laser including a semiconductor laser diode for outputting an optical signal, and a wavelength selection filter. The user-selectable laser may allow a user to select a wavelength selection filter which is optically coupled with the semiconductor laser diode and selectively causes oscillation at the wavelength of an optical signal output from the semiconductor laser diode.

16 Claims, 16 Drawing Sheets

(56) References Cited

U.S. PATENT DOCUMENTS

2006/0280220 A1* 12/2006 Yoo .............................. 372/99
2010/0232458 A1    9/2010 Kim et al.
2011/0150016 A1    6/2011 Park et al.
2011/0217042 A1*  9/2011 Chen .............................. 398/58

FOREIGN PATENT DOCUMENTS

| KR | 10-0945423    | 3/2010 |
| KR | 1020110073232 | 6/2011 |

* cited by examiner

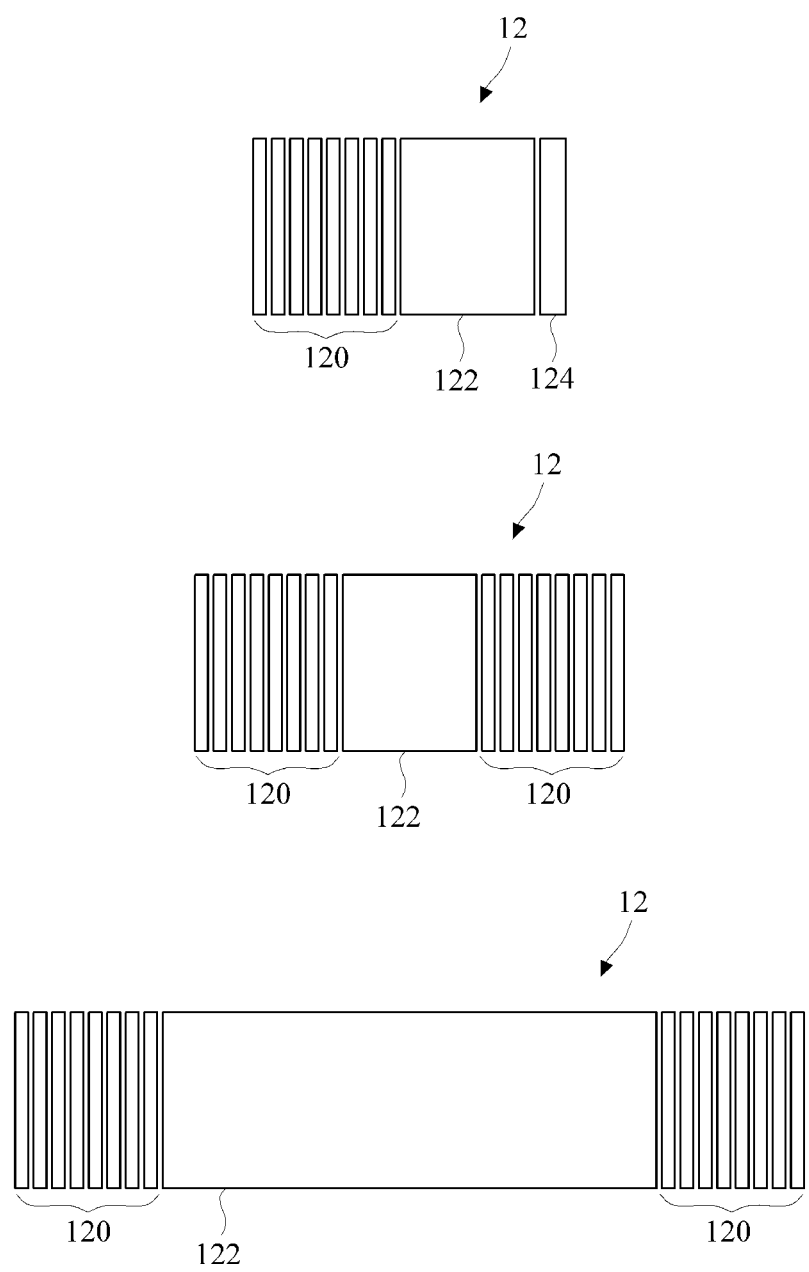

USER-SELECTABLE LASER AND OPTICAL TRANSMITTER HAVING THE SAME

CROSS-REFERENCE TO RELATED APPLICATION

This application claims the benefit under 35 U.S.C. §119 (a) of Korean Patent Application No. 10-2011-0141220, filed on Dec. 23, 2011, the entire disclosure of which is incorporated herein by reference for all purposes.

BACKGROUND

1. Field

The following description relates to wired/wireless network technology, and more particularly, to wavelength division multiplexing.

2. Description of the Related Art

Recently, due to the introduction of portable multi-function devices, such as smart phones, smart TVs, etc., excessive traffic is generated in wired/wireless networks. In order to cope with such excessive traffic, studies into applying Wavelength Division Multiplexing (WDM) to a wired subscriber network or an integrated wired/wireless subscriber network are actively conducted. The WDM is a method of multiplexing multiple optical wavelengths and transporting them over a single optical fiber at the same time, so that the WDM can greatly reduce the cost of lines by the number of the optical wavelengths, as well as having many advantages in view of security, Quality of Service (QoS), and protocol transparency since each data channel is carried on its own unique wavelength.

In order to use the WDM, each subscriber device has to be allocated its own wavelength for communication with other parties. This requires optical sources with a number of unique wavelengths corresponding to the number of subscribers belonging to a wired subscriber network that is spread across remote nodes, or the number of separated-type base stations that exist in an integrated wired/wireless network. The need for optical sources with various unique wavelengths indicates that different specific kinds of optical sources should be further prepared, in view of fabrication, installation, and equipment management, in case failure occurs. This further requirement may be a considerable burden to providers. For these reasons, studies into development and commercialization of a wavelength-independent optical source are more actively conducted.

Wavelength-independent optical sources can be broadly classified into two types: one is a reflective optical source, such as a Reflective Semiconductor Optical Amplifier (RSOA) or a Fabry-Perot laser diode; and the other is a wavelength-tunable optical source whose lasing wavelength can be tuned. The transmission performance of the reflective optical source strongly depends on the power level of injected seed light. Therefore, the link would have some constraints, such as scalability and transmission distance. The wavelength-tunable optical source is considered as an attractive solution due to its flexibility. However, the output wavelength of the wavelength tunable optical source is variable; therefore, the wavelength initialization process is indispensably necessary before starting communication. A straightforward and simple way to achieve wavelength initialization is using the lookup table, usually predetermined and loaded in the tunable transmitter module. A lookup table has to be generated for each of the lasers because of the manufacturing variations. Moreover, the value of the control parameters in the lookup table need to be adjusted due to either laser aging or temperature changes. Although the time for generating the lookup table depends on the tuning mechanisms of the laser diodes, and there are some proposals to generate lookup tables in a short time, the overall generating process is exhaustive and requires a time-consuming scanning process. This can increase the devices' packaging cost.

Korean Patent Registration No. 10-0945423 discloses a tunable external cavity laser which tunes an output wavelength using the Littmann-Metcaff scheme, Korean Patent Registration No. 10-0945422 discloses a tunable external cavity laser which applies heat near a waveguide configuring Bragg gratings, and Korean Laid-Open Patent Application No. 10-2011-00732232 discloses a tunable laser module which tunes a wavelength by integrating a narrow-band wavelength tunable laser.

SUMMARY

The following description relates to a user-selectable laser which allows a user to select optical output characteristics including a lasing wavelength of a laser of an optical transmitter or light intensity such that the optical transmitter outputs a wavelength corresponding to a channel allocated to an optical subscriber terminal in a wired network or to a separated-type base station is in an integrated wired/wireless network, and the optical transmitter including the user-selectable laser.

In one general aspect, there is provided a user-selectable laser including a semiconductor laser diode, and a wavelength selection filter. The user-selectable laser may be an external cavity laser. The user-selectable laser may allow a user to select a wavelength selection filter which is optically coupled with the semiconductor laser diode and selectively causes oscillation at the wavelength of an optical signal output from the semiconductor laser diode.

The user-selectable laser may allow a user to select or control the wavelength selection filter to select an optical output characteristic. Here, the wavelength selection filter may be removably attached to the package of the user-selectable laser, or the wavelength selection filter may have a structure that allows a user to tune the wavelength selection filter externally even when it is installed in the package of the user-selectable laser. That is, if the user manipulates the user-selectable laser in such a way to rotate the user-selectable laser, an optical signal incident angle of the wavelength selection filter is changed to change the transmission wavelength of the wavelength selection filter, resulting in changing the optical output characteristics.

Other features and aspects will be apparent from the following detailed description, the drawings, and the claims.

BRIEF DESCRIPTION OF THE DRAWINGS

FIGS. 2B and 2C show various examples of wavelength selection filters.

Figure 1:
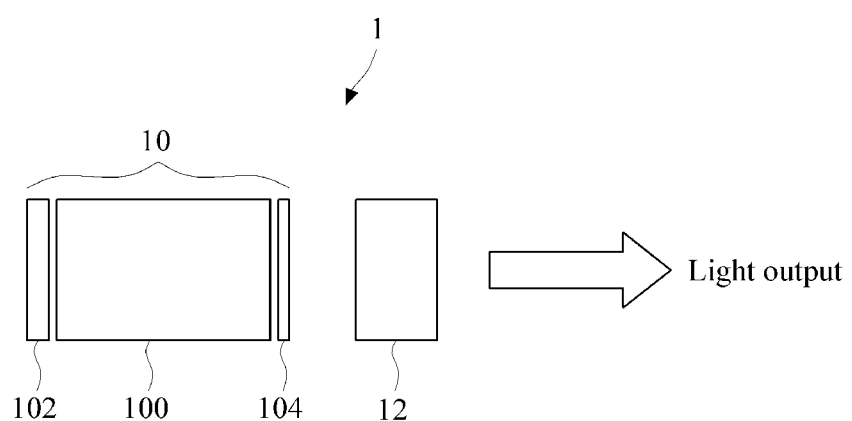
FIG. 1 shows an example of a user-selectable laser.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION is The following description is provided to assist the reader in gaining a comprehensive understanding of the methods, apparatuses, and/or systems described herein. Accordingly, various changes, modifications, and equivalents of the methods, apparatuses, and/or systems described herein will suggest themselves to those of ordinary skill in the art. Also, descriptions of well-known functions and constructions may be omitted for increased clarity and conciseness.

FIG. 1 shows an example of a user-selectable laser 1.

Referring to FIG. 1, the user-selectable laser 1 is an external cavity laser, and includes a semiconductor laser diode 10 and a wavelength selection filter 12. The user-selectable laser 1 may be installed in an optical subscriber terminal belonging to a wired network, or in a separated-type base station that exists in an integrated wired/wireless network.

The semiconductor laser diode 10 is formed on an active medium 100 to output optical signals. The exit surface 104 of the active medium 100 may be anti-reflection (AR) coated, and the rear surface 102 of the active medium 100 may be high-reflection (HR) coated.

The semiconductor laser diode 10 is optically coupled with the wavelength selection filter 12, thereby forming an external cavity. In the current example, the user may be an engineer or network manager who installs an optical subscriber terminal with an optical transmitter having the user-selectable laser 1. Or, the user may be an operator of a separated-type base station that exists in an integrated wired/wireless network, or an engineer who installs an optical source in the separated-type base station.

According to an example, the user-selectable laser 1 enables the user to select a wavelength selection filter 12 having optical output characteristics for oscillation in an oscillation mode corresponding to a predetermined wavelength allocated for optical transmission. Here, the wavelength selection filter 12 may be removably attached to a package of the user-selectable laser 1, or the wavelength selection filter 12 may have a structure that allows, even when it is installed in the package of the user-selectable laser 1, the user to tune the wavelength selection filter 12 externally. Accordingly, the user may select the wavelength of an optical output. Also, according to the optical output characteristics of the wavelength selection filter 12, an oscillation mode and light intensity, as well as the wavelength of an optical output, may be selected.

Figure 2A:
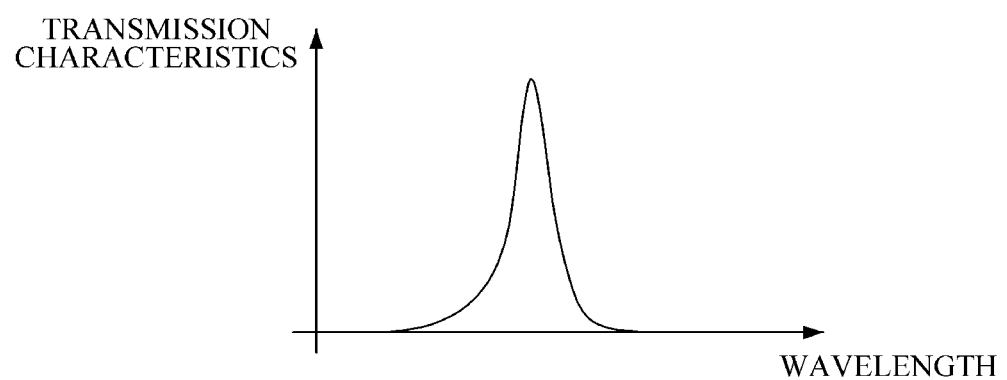
FIG. 2A is a graph showing light transmission characteristics of a wavelength selection filter included in the user-selectable laser of FIG. 1.

FIG. 2A is a graph showing an example of light transmission characteristics of the wavelength selection filter 12 of FIG. 1.

Since the wavelength selection filter 12 is optically coupled with the semiconductor laser diode 10 (see FIG. 1) to configure an external cavity, the wavelength selection filter 12 has to reflect a specific wavelength band, as shown in FIG. 2A.

Figure 2C:
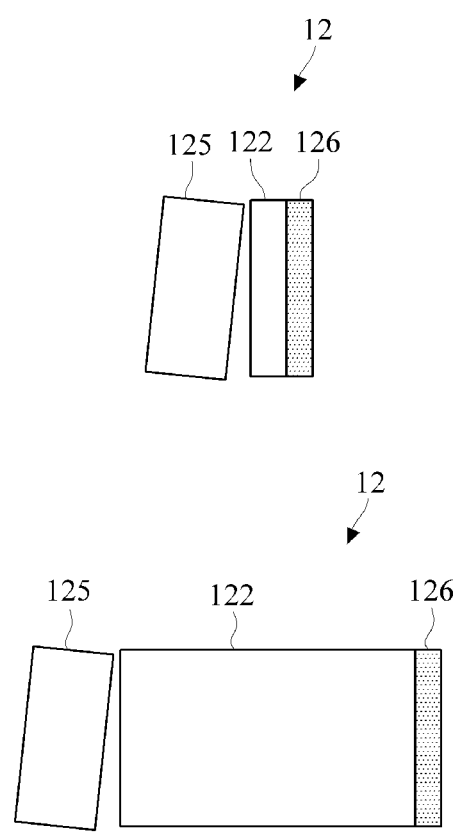

FIGS. 2B and 2C show various examples of wavelength selection filters.

A wavelength selection filter may have an integrated structure (see FIG. 2B) or a split structure (see FIG. 2C) as long as the wavelength selection filter has the optical transmission characteristics as shown in FIG. 2A.

In detail, if a wavelength selection filter has an integrated structure as shown in FIG. 2B, the front surface 124 of a glass block 122 is AR coated, and the rear surface 120 of the glass block 122 is subject to multilayer thin-film coating such that the rear surface 120 reflects only a specific wavelength. Or, the multilayer thin-film coating may be applied to both the front and rear surfaces 120 of the glass block 122. Here, the glass block 122 may be a glass plate, a ferrule 500, or a specific substrate for multilayer thin-film coating.

Meanwhile, if a wavelength selection filter has a split structure as shown in FIG. 2C, the wavelength selection filter may include a band-transmission multilayer thin-film coated filter 125, a glass block 122, and a partial-reflection coated layer 126. Like the example of FIG. 2B, the glass block 122 may be a glass plate, a ferrule, or any other appropriate element. The band-transmission multilayer thin-film coated filter 125 may be arranged in an inclined position, as shown in FIG. 2C, however, the band-transmission multilayer thin-film coated filter 125 also may be arranged in parallel to the glass block 122.

Figure 3:
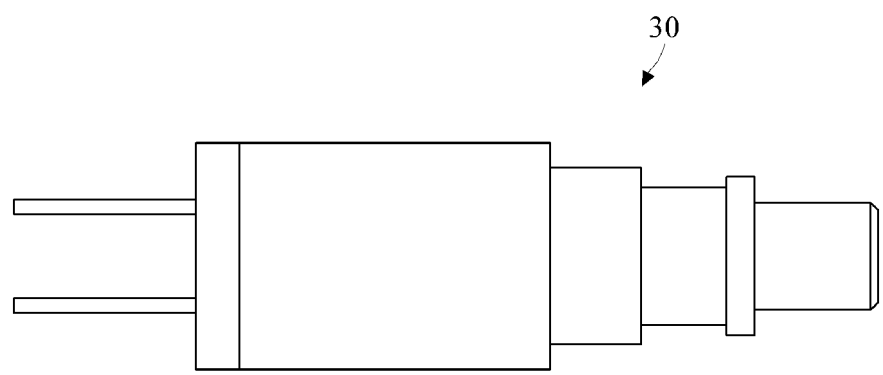
FIG. 3 shows an example of a Transmitter Optical Sub Assembly (TOSA) into which a semiconductor laser diode is packaged.
Figure 4A:
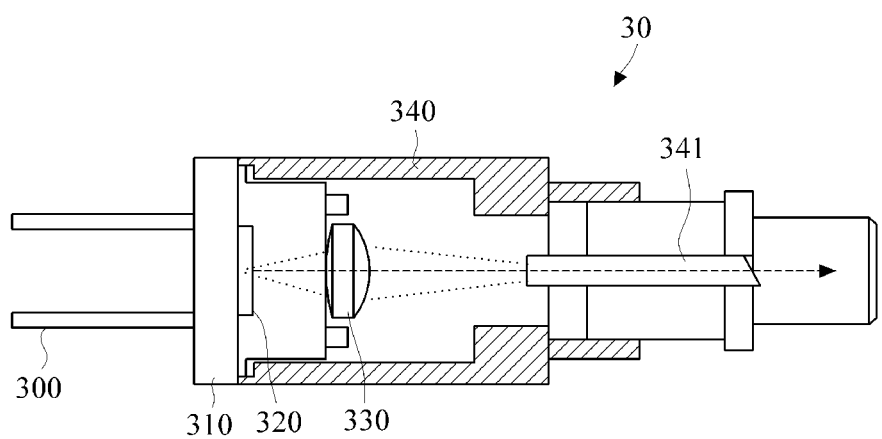
FIG. 4A is a cross-sectional view of the TOSA illustrated in FIG. 3.
Figure 4B:
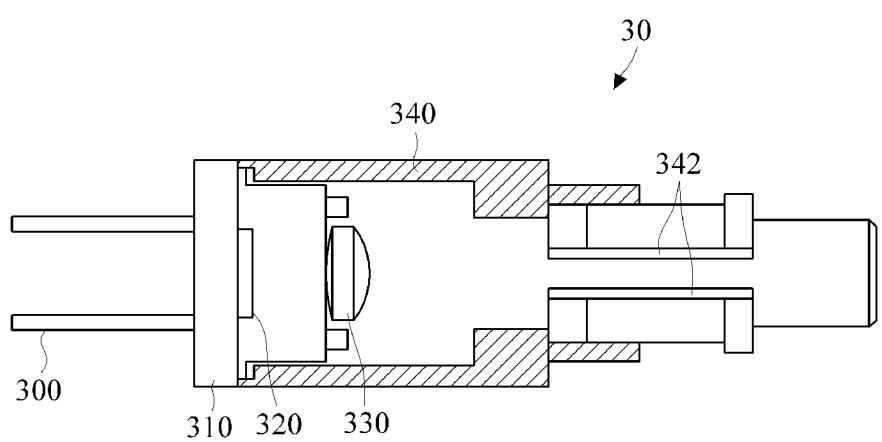
FIG. 4B is a cross-sectional view of another example of a TOSA into which a semiconductor laser diode is packaged.

FIG. 3 shows an example of a Transmitter Optical Sub Assembly (TOSA) 30 into which a semiconductor laser diode is packaged, FIG. 4A is a cross-sectional view of the TOSA 30, and FIG. 4B is a cross-sectional view of another example of a TOSA 30.

Referring to FIGS. 3, 4A, and 4B, a user may insert a wavelength selection filter into the TOSA 30, wherein the TOSA 30 includes an optical transmitter package including a semiconductor laser diode chip 320, and a housing 340 that is arranged and coupled with the optical transmitter package.

The optical transmitter package includes a stem 310 to which output terminals 300 are attached, and the laser diode chip 320 attached on the stem 310 and configured to generate optical signals. The optical transmitter package may be a TO-CAN package. A lens 330 acts to collect optical signals transferred from the laser diode chip 320. That is, if current is applied to the laser diode chip 320 to generate an optical signal, the optical signal passes through the lens 300 to form an image at a predetermined distance. Meanwhile, the TOSA 30 may include a ferrule 341 (see FIG. 4A) or a sleeve 342 (see FIG. 4B).

Figure 5A:
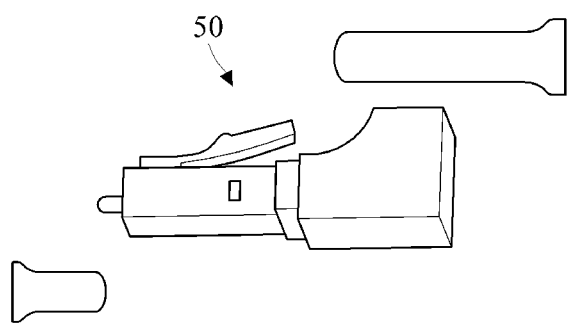
FIG. 5A shows an example of a wavelength selection clip into which the wavelength selection filter of FIG. 1 is packaged.
Figure 5B:
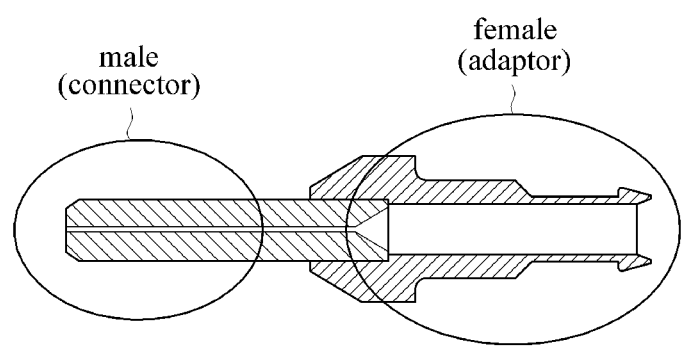
FIG. 5B is a cross-sectional view of the wavelength selection clip of FIG. 5A.

FIG. 5A shows an example of a wavelength selection clip 50 into which a wavelength selection filter is packaged, and FIG. 5B is a cross-sectional view of the wavelength selection clip 50.

Referring to FIGS. 5A and 5B, the wavelength selection filter has a structure that can be removably attached to a receptacle TOSA through the wavelength selection clip 50. In more detail, one portion of the wavelength selection clip 50 is formed in the shape of a connector (that is, in a "male" shape)

that can be removably attached to a receptacle TOSA, and the other portion of the wavelength selection clip 50 is formed in the shape of an adaptor (that is, in a "female" shape) that can be connected to another optical fiber patch cord.

Figure 5C:
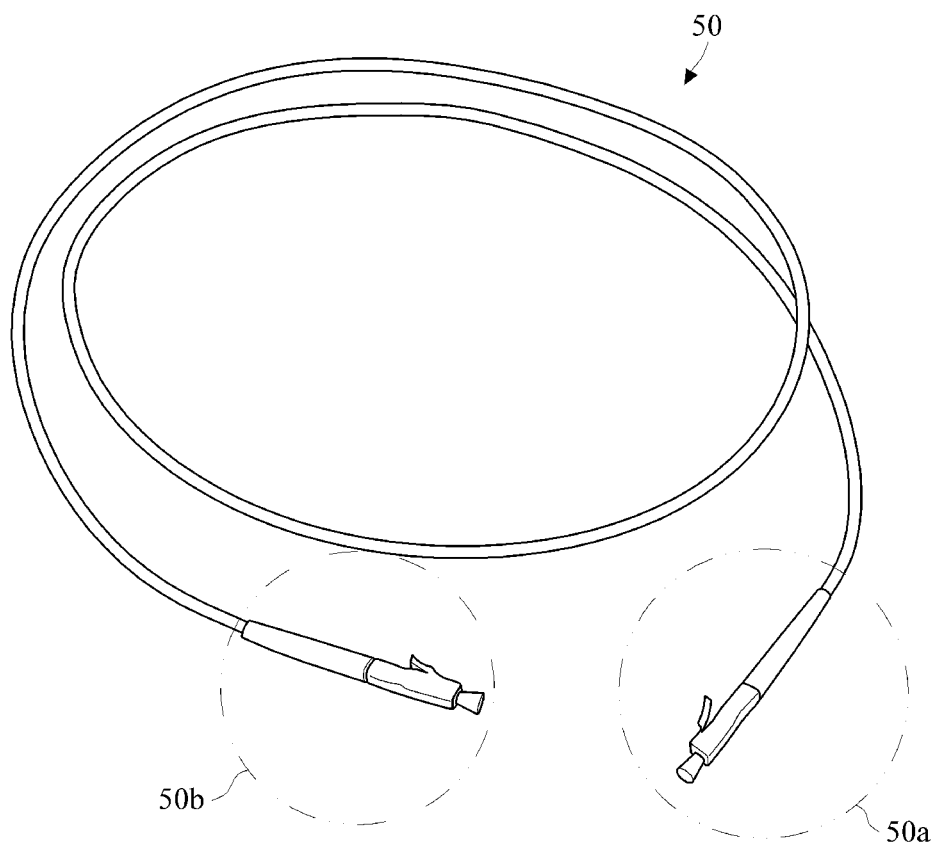
FIG. 5C shows another example of a wavelength selection clip.

FIG. 5C shows another example of a wavelength selection clip 50.

Referring to FIG. 5C, the wavelength selection clip 50 may be configured in the shape of a patch cord. That is, if the wavelength selection clip 50 is configured in the shape of a patch cord, one portion of the wavelength selection clip 50 is formed in the shape of a male connector of FIG. 5B, as denoted by a reference number 50a, and the other portion of the wavelength selection clip 50 is formed in the shape of a general optical fiber patch cord, as denoted by a reference number 50b. Thus, the wavelength selection clip 50 does not need to connect to any other patch cord in the shape of a female adaptor of FIG. 5B. In this case, a wavelength selection filter may be inserted into the male connector or attached onto the surface of the male connector.

However, the external and internal configurations of the wavelength selection clip 50, as shown in FIGS. 5A, 5B and 5C, are only exemplary, and it will be obvious to one of ordinary skill that various modifications may be made within the scope of the present invention.

Figure 6:
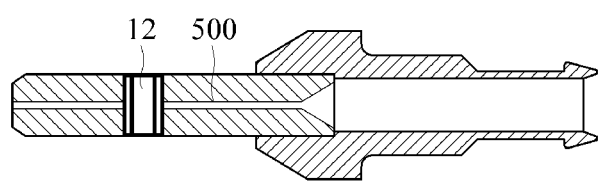
FIGS. 6 and 7 are cross-sectional views of examples of wavelength selection clips that are removably attached to receptacle TOSAs.
Figure 7:
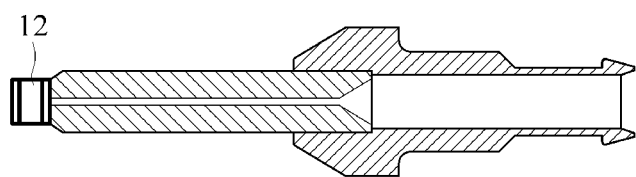

FIGS. 6 and 7 are cross-sectional views of examples of wavelength selection clips that can be removably attached to receptacle TOSAs.

According to an example, in the case of a wavelength selection clip having a structure that can be removably attached to a receptable TOSA (see FIG. 4A) including a ferrule, a wavelength selection filter 12 is inserted into a ferrule configuring the wavelength selection clip, as illustrated in FIG. 6. At this time, other components including a lens may be inserted after or before the wavelength selection filter 12.

According to another example, in the case of a wavelength selection clip having a structure that can be removably attached to a receptacle TOSA (see FIG. 4B) including no ferrule, a wavelength selection filter 12 may be attached to an end of a connector of the wavelength selection clip, as illustrated in FIG. 7. The wavelength selection filter 12 may be attached to the wavelength selection clip with adhesive or through a fixing unit that can fix the wavelength selection filter 12. A method of attaching a wavelength selection filter to a wavelength selection clip is not limited to these.

Figure 8:
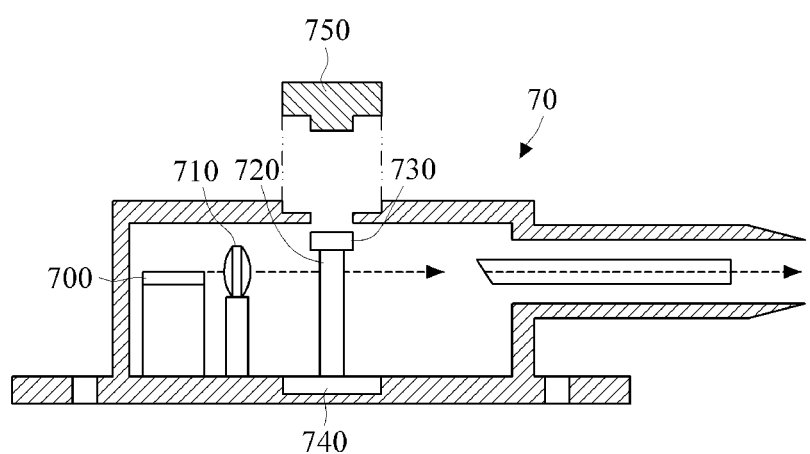
FIG. 8 is a cross-sectional view showing another example of a package of a user-selectable laser.

FIG. 8 is a cross-sectional view showing another example of a package of a user-selectable laser 70.

Referring to FIG. 8, the user-selectable laser 70 includes a base plate for rotating a wavelength selection filter 720 while supporting the wavelength selection filter 720. When the base plate is rotated by a user, an optical signal incident angle of the wavelength selection filter 720 is changed.

According to an example, the base plate includes a lower base plate part 740 that is coupled with the lower portion of the wavelength selection filter 720 and supports the wavelength selection filter 720, and a upper base plate part 730 that is coupled with the upper portion of the wavelength selection filter 720 and is formed in a saw-toothed shape that is rotatable by a wrench type tool 750. Accordingly, if the user rotates the upper base plate part 730 with the wrench type tool 750, the wavelength selection filter 720 connected to the upper base plate part 730 is accordingly rotated.

According to another aspect, the user-selectable laser 70 includes a lens 710 that is disposed between the wavelength selection filter 720 and a semiconductor laser diode chip 700 and collects optical signals output from the semiconductor laser diode chip 700.

Figure 9:
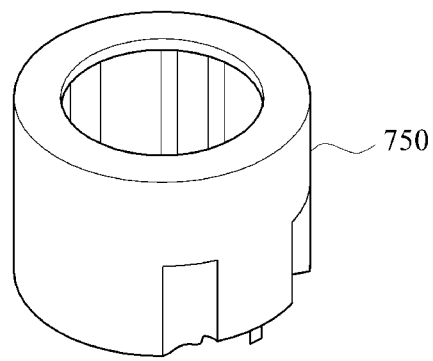
FIG. 9 is a perspective view showing in detail a wrench type tool of FIG. 8.
Figure 10:
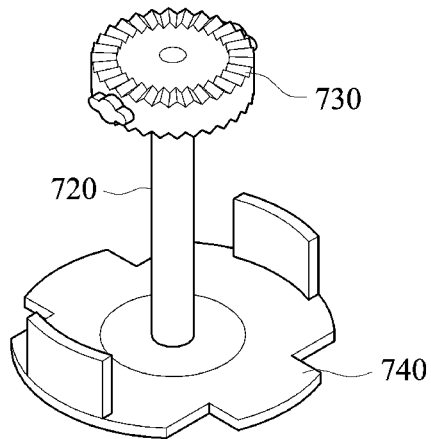
FIG. 10 is a perspective view showing a coupled state of a wavelength selection filter and a base plate of FIG. 8.

FIG. 9 is a perspective view showing in detail the wrench type tool 750 of FIG. 8, and FIG. 10 is a perspective view showing a coupled state of the wavelength selection filter 720 and the upper and lower base plate parts 730 and 740 of FIG. 8.

Referring to FIGS. 9 and 10, the base plate consists of the lower base plate part 740 and the upper base plate part 730, and the upper base plate part 730 has a saw-toothed shape that can be rotated by the wrench type tool 750. Accordingly, a rotation angle of the wavelength selection filter 720 may be precisely controlled.

Figure 11:
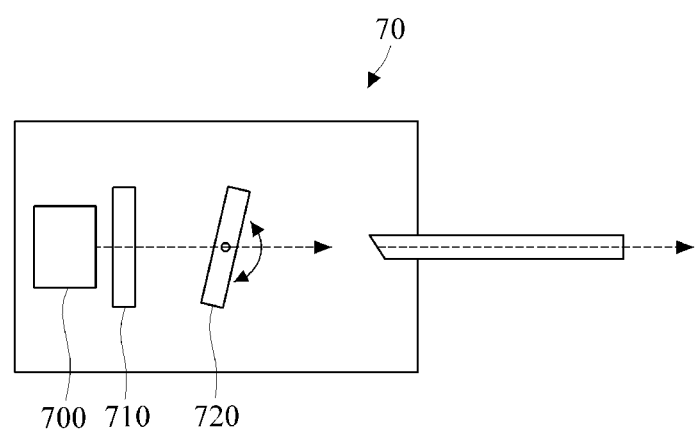
FIG. 11 is a plan view of the user-selectable laser package of FIG. 8.

FIG. 11 is a plan view of the package of the user-selectable laser 70 of FIG. 8.

Referring to FIG. 11, when the wavelength selection filter 720 is rotated by a user, an optical signal incident angle of the wavelength selection filter 720 is changed to change a transmission wavelength, thereby changing optical output characteristics. Here, the optical output characteristics include light intensity and an oscillation mode for optical signal oscillation at a predetermined wavelength corresponding to a channel allocated for optical transmission.

Therefore, according to the examples described above, processes of adjusting a lasing wavelength by heating Bragg gratings through a heater to tune a lasing wavelength, of creating a lookup table by simulating driving conditions for oscillating at predetermined wavelengths allocated to individual optical sources, of initializing the lasing wavelength, and of detecting any changes in lasing wavelength for wavelength stabilization are no longer needed. Since the above-mentioned processes are not needed, cost reduction and reduction in packaging time may be achieved. In addition, no memory for storing the corresponding information is needed, which results in a significant reduction in size and production cost of the user-selectable laser and the optical transmitter including the user-selectable laser.

Accordingly, a user can select optical output characteristics, such as an output wavelength or light intensity, of a user-selectable laser such that an optical transmitter using a user-selectable optical source and installed in an optical subscriber terminal belonging to a wired network or in a separated-type base station that exists in an integrated wired/wireless network outputs a wavelength corresponding to a channel allocated to the subscriber terminal or the separated-type base station.

That is, the user can set the output wavelength of the optical transmitter by selecting a wavelength selection filter for optical signal oscillation at a predetermined wavelength allocated for optical transmission and inserting the selected wavelength selection filter into the package of the user-selectable laser, or by rotating a wavelength selection filter installed in the package of the user-selectable laser.

Accordingly, upon management of a network that uses optical transmitters, neither a process of creating a lookup table nor a process of initializing a lasing wavelength are required. Since the processes are no longer needed, cost reduction and reduction in packaging time may be achieved. In addition, no memory for storing a lookup table is needed, which results in a significant reduction in size and production cost of the user-selectable laser and the optical transmitter including the user-selectable laser.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A user-selectable laser comprising:
a semiconductor laser diode configured to output an optical signal;
a wavelength selection filter configured to be optically coupled with the semiconductor laser diode, and to select an oscillation wavelength of the optical signal output from the semiconductor laser diode,
wherein the wavelength selection filter is selected by a user,
wherein the wavelength selection filter is removably attached to an optical transmitter and the user may change optical output characteristics of the optical transmitter by applying a different wavelength selection filter,
wherein the wavelength selection filter is inserted into a package of the user-selectable laser through a wavelength selection clip.

2. The user-selectable laser of claim 1, wherein a wavelength selection filter having optical output characteristics for optical signal oscillation in an oscillation mode corresponding to a predetermined wavelength allocated for optical transmission is selected by the user, and
the selected wavelength selection filter is removable attached to a package of the user-selectable laser by the user.

3. The user-selectable laser of claim 2, wherein the wavelength selection filter has an integrated structure including a multilayer thin-film coated layer, a glass block, and an anti-reflection coated layer such that the wavelength selection filter reflects only a predetermined wavelength band.

4. The user-selectable laser of claim 2, wherein the wavelength selection filter has a split structure including a band-transmission thin-film coated layer, a glass block, and a partial-reflection coated layer.

5. A user-selectable laser comprising:
a semiconductor laser diode configured to output an optical signal;
a wavelength selection filter configured to be optically coupled with the semiconductor laser diode, and to select an oscillation wavelength of the optical signal output from the semiconductor laser diode,
wherein the wavelength selection filter is selected by a user,
wherein a wavelength selection filter having optical output characteristics for optical signal oscillation in an oscillation mode corresponding to a predetermined wavelength allocated for optical transmission is selected by the user, and the selected wavelength selection filter is removable attached to a package of the user-selectable laser by the user,
wherein the wavelength selection filter is inserted into a Transmitter Optical Sub Assembly (TOSA) through a wavelength selection clip, wherein the TOSA includes an optical transmitter package having a semiconductor laser diode chip, and a receptacle arranged and coupled with the optical transmitter package.

6. The user-selectable laser of claim 5, wherein the wavelength selection filter is inserted into a ferrule configuring the wavelength selection clip.

7. The user-selectable laser of claim 5, wherein the wavelength selection filter is attached to one end of the wavelength selection clip.

8. The user-selectable laser of claim 5, wherein one portion of the wavelength selection clip is formed in the shape of a male connector that is able to be removably attached to a receptacle TOSA, and the other portion of the wavelength selection clip is formed in the shape of a female adaptor that is able to be connected to an optical fiber patch cord, and
the wavelength selection filter is inserted into or attached to the portion of the wavelength selection clip in the shape of the male connector.

9. The user-selectable laser of claim 5, wherein one portion of the wavelength selection clip is formed in the shape of a male connector that is able to be removably attached to a receptacle TOSA, and the other portion of the wavelength selection clip is formed in the shape of an optical fiber patch cord, and
the wavelength selection filter is inserted into or attached to the portion of the wavelength selection clip in the shape of the male connector.

10. The user-selectable laser of claim 1, wherein the wavelength selection filter enables a user to select optical output characteristics for optical signal oscillation in a predetermined oscillation mode, by allowing the user to rotate the wavelength selection filter to change an optical signal incident angle of the wavelength selection filter, to change a transmission wavelength of the wavelength selection filter, and to thereby change the optical output characteristics.

11. The user-selectable laser of claim 10, further comprising a base plate configured to be rotated while supporting the wavelength selection filter,
wherein when the base plate is rotated by the user, the optical signal incident angle of the wavelength selection filter is changed.

12. The user-selectable laser of claim 11, wherein the base plate comprises:
a lower base plate part configured to be coupled with a lower portion of the wavelength selection filter and support the wavelength selection filter; and
a upper base plate part configured to be coupled with a upper portion of the wavelength selection filter and formed in a saw-toothed shape that is rotatable by a wrench type tool.

13. The user-selectable laser of claim 10, further comprising a lens configured to be disposed between the semiconductor laser diode and the wavelength selection filter, and to collect optical signals output from the semiconductor laser diode.

14. An optical transmitter comprising a user-selectable laser including a semiconductor laser diode configured to output an optical signal, and a wavelength selection filter configured to be optically coupled with the semiconductor laser diode and to select an oscillation wavelength of the optical signal output from the semiconductor laser diode,
wherein the wavelength selection filter is selected by a user,
wherein the wavelength selection filter is removably attached to an optical transmitter and a user may change the optical output characteristics of the optical transmitter by applying a different wavelength selection filter,
wherein the wavelength selection filter is inserted into a package of the user-selectable laser through a wavelength selection clip.

15. The optical transmitter of claim 14, wherein the user-selectable laser receives the user's selection on optical output characteristics for optical signal oscillation in a predetermined oscillation mode, by allowing the user to select a wavelength selection filter for optical signal oscillation at a predetermined wavelength allocated for optical transmission and inserting the selected wavelength selection filter into the user-selectable laser.

16. The optical transmitter of claim 14, wherein the user-selectable laser receives the user's selection on optical output characteristics for optical signal oscillation in a predetermined oscillation mode, by allowing the user to rotate the wavelength selection filter included in the user-selectable laser.

* * * * *